United States Patent
Huang et al.

(10) Patent No.: US 6,267,121 B1
(45) Date of Patent: Jul. 31, 2001

(54) PROCESS TO SEASON AND DETERMINE CONDITION OF A HIGH DENSITY PLASMA ETCHER

(75) Inventors: Cheng-Hao Huang, Taipei; Ming-Shuo Yen, Taitung; Shih-Fang Chen, Sanchang; Wen-Hsiang Tang, Taipei; Pei-Hung Chen, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/248,343

(22) Filed: Feb. 11, 1999

(51) Int. Cl.$^7$ .......................................... B08B 5/00
(52) U.S. Cl. ..................... 134/1.1; 134/1.2; 134/2; 134/22.1; 216/60; 216/67; 216/68; 216/79; 438/9; 438/710; 438/719; 438/905
(58) Field of Search ................... 134/1, 1.1, 1.2, 134/2, 22.1; 216/60, 67, 68, 79; 438/9, 710, 719, 905

(56) References Cited

U.S. PATENT DOCUMENTS

| | | |
|---|---|---|
| 5,256,245 | 10/1993 | Keller et al. .................. 156/643 |
| 5,477,975 | * 12/1995 | Rice et al. ...................... 216/68 |
| 5,585,012 | 12/1996 | Wu et al. ....................... 216/71 |
| 5,632,910 | * 5/1997 | Nagayama et al. ............. 216/47 |
| 5,756,400 | 5/1998 | Ye et al. ....................... 438/710 |
| 5,811,356 | * 9/1998 | Murugesh et al. .............. 216/67 |
| 5,824,607 | * 10/1998 | Trow et al. .................... 216/70 |
| 5,865,896 | * 2/1999 | Nowak et al. ............... 118/723 I |
| 5,976,986 | * 11/1999 | Naeem et al. ................ 438/714 |
| 6,068,784 | * 5/2000 | Collins et al. ................. 216/68 |
| 6,096,232 | * 8/2000 | Hashimoto ..................... 216/68 |

FOREIGN PATENT DOCUMENTS 9-082690 A2 * 3/1997 (JP) .
11-297676 A * 10/1999 (JP) .

* cited by examiner

*Primary Examiner*—Randy Gulakowski
*Assistant Examiner*—Michael Kornakov
(74) *Attorney, Agent, or Firm*—George O. Saile; Stephen B. Ackerman

(57) ABSTRACT

An improved seasoning process for a plasma etching chamber is described. This has been achieved by increasing the RF power to both the wafer and the walls of the chamber during seasoning. Additionally, the gas that is used is at a pressure of about 10 mTorr and has the following composition: chlorine about 90% and oxygen about 10%. By observing the optical emission spectrum during seasoning (notably lines due to the $SiCl_x$ species) it is confirmed that, under these conditions, seasoning is completed by using only a single wafer for about 100 seconds.

19 Claims, 2 Drawing Sheets

PROCESS TO SEASON AND DETERMINE CONDITION OF A HIGH DENSITY PLASMA ETCHER

FIELD OF THE INVENTION

The invention relates to the general field of plasma etching with particularly reference to the seasoning of freshly cleaned etch chambers.

BACKGROUND OF THE INVENTION

Reactive ion etching is usually performed in a chamber designed to hold a single silicon wafer. With the wafer in place, a reactive gas is admitted into the chamber and a high density plasma discharge is initiated, most commonly in the form of a TCP (transformer coupled plasma). Typically the power level that is used is about 200 watts and etching is allowed to proceed for about 5 minutes. This apparatus may be used over and over again for different wafers but, over a period of time, a layer of material that is a byproduct of the etch reaction builds up on the walls of the chamber. Eventually this layer grows to be thick enough to be a problem because of particulate matter that flakes off its surface.

Thus, it becomes necessary to periodically clean the inside walls of the chamber. This is typically done using some sort of dry cleaning process. Once the walls have been cleaned the chamber may be used again for the reactive ion etching of many more wafers. However it turns out that the electrical characteristics of the chamber are altered by this cleaning process and do not return to normal until the unit has been run in etch mode for a certain amount of time. To avoid wasting product wafers it is standard practice to 'season' a freshly cleaned chamber using blank wafers.

Prior to the present invention it was found necessary to use as many as 12 wafers before a chamber could be considered to be satisfactorily seasoned. Seasoning was performed in three steps as listed in TABLE I below:

TABLE I

| RF power in watts | | flow rate of gases (SCCM) | | | pressure | time in |
|---|---|---|---|---|---|---|
| source | bias | $Cl_2$ | HBr | $He-O_2$ | mTorr | seconds |
| 250 | 170 | 50 | — | 2 | 4 | 40 |
| 250 | 200 | 50 | 150 | — | 10 | 40 |
| 350 | 180 | — | 270 | 3.3 | 60 | 60 |

Thus, since the wafers had to be seasoned in sequence (since a chamber holds only one wafer at a time) this implies a total time of at least 28 minutes to complete the seasoning process. In the context of a production line this represents a significant downtime for a key component of the line.

In FIG. 1 we illustrate, schematically, the apparatus used to effect the seasoning process. Wafer 1 is seen present inside etch chamber 2 in which a plasma (symbolized by arrows 3) has been initiated through RF excitation by Coil 8. The progress of the seasoning process is most easily monitored by observing the optical emission spectrum of the plasma As we will discuss below, light from the chamber is directed along glass fiber 4 where it is detected by photomultiplier tube 5 after it has been analyzed by a suitable device such as a monochromator.

Since chlorine is present in the reactive gas it is convenient to monitor the intensity of the silicon chloride species $SiCl_x$ in the gas. Spectral lines associated with this radical occur at 280.4 and 282 nm. In FIG. 2 a series of spectra obtained by monitoring the plasma during seasoning are shown. Curve 21 shows the spectrum seen immediately after dry clean. Curve 22 is the spectrum seen during seasoning by the second wafer and so on for a succession of wafers until there is no further rise in the intensity beyond curve 23 which would be obtained during seasoning with the 12th wafer. A similar asymptotic increase in intensity for successive wafers is seen at wave lengths 288 nm which is due to silicon.

The present invention teaches a method that uses only one wafer for achieving the same results previously obtained with 12 wafers. In the course of searching the prior art no relevant references to the process described in the present invention were found. One or two references of interest were, however, encountered. Thus, Wu et al. (U.S. Pat. No. 5,585,012) keep the top electrode of their etcher under weak RF power, either continuously or in spurts, thereby removing deposited material through RF sputtering as soon as it forms and thus eliminating the need to dry clean the unit.

Ye et al. (U.S. Pat. No. 5,756,400) give a description of the dry cleaning procedure itself Said procedure is very short and is applied at frequent intervals so that relatively little downtime results. Keller et al. (U.S. Pat. No. 5,256,245) also described a dry cleaning procedure based on using an oxygen scavenging gas together with a volatile fluoride. Murugesh et al. describe a seasoning process wherein higher than customary bias RF power is used with the time for seasoning being increased slightly. Their recommended cleaning gases include $NF_3$, $CF_4$, and $C_2F_6$. Seasoning in their case was used to prepare the chamber for a CVD process rather than for sputter etching.

SUMMARY OF THE INVENTION

It has been in object of the present invention to provide a process for plasma etching wherein the downtime associated with preventive maintenance is greatly reduced.

Another object of the present invention has been to reduce the seasoning time associated with restoring normal operation of a plasma etching chamber.

A further object of the invention has been to use a single blanket wafer for the seasoning process.

These objects have been achieved by increasing the RF power to both the wafer and the walls of the chamber during seasoning. Additionally, the gas that is used has the following composition: chlorine about 90%, oxygen about 10%. By observing the optical emission spectrum during seasoning (notably lines due to the $SiCl_x$ species) it is confirmed that, under these conditions, seasoning is completed by using only a single wafer for about 100 seconds.

DESCRIPTION OF THE PREFERRED EMBODIMENTS

The present invention provides a method for plasma etching of a large number of wafers over an extended period of time with relatively little maintenance of the etching chamber required.

Figure 1:
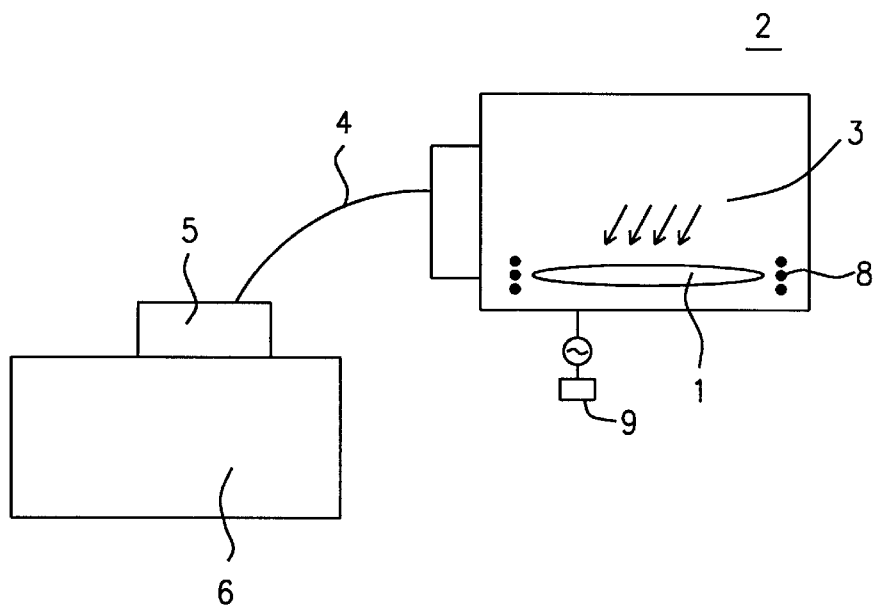
FIG. 1 is a schematic representation of the apparatus used for exercising the process of the present invention.

Plasma etching takes place in a standard chamber comprising a lower electrode which holds a single silicon wafer (containing a partially completed integrated circuit) whose diameter is between about 15 and 20 cm. The etching chamber is first pumped out and then a mixture of gases, typically oxygen, hydrogen bromide, and helium-oxygen, is admitted at flow rates of about 2–300 SCCM. thereby establishing an equilibrium pressure of between about 4 and 60 millitorr. A plasma of the TCP (transformer coupled plasma) type is then established within the chamber (see Coil 8 in FIG. 1) by exposing the gas to alternating electric and magnetic fields which results in the etching of all unprotected surfaces of the silicon. This is allowed to proceed for between about 4 and 6 minutes.

As already discussed above, the chamber may be used in this manner for many different wafers (in practice between about 90 and 110 times with 100 times being fairly typical). However, material that is a byproduct of the etching process gradually builds up on the interior walls of the chamber and eventually becomes thick enough to start peeling. This causes a problem because the material that flakes off will contaminate the product.

To head off the possibility of the walls becoming too heavily coated, the interior walls are thoroughly cleaned on a routine schedule as a form of preventive maintenance. The type of cleaning that is performed is known as dry cleaning since no water, or any other liquid, is used. Instead, dry cleaning is performed by exposing a single thermally oxidized wafer to a plasma of $SF_6$ gas at a source power of about 700 watts for about 300 seconds.

Once dry cleaning has been satisfactorily completed it becomes necessary to 'season' the unit. As already discussed, this involves the re-deposition of sufficient etch product on the walls of the chamber to return the electrical characteristics of the latter to that which normally prevails during plasma etching.

In a key feature of the invention, only a single blank silicon wafer is used. A mixture of gases having the following composition is admitted into the chamber:

chlorine at a concentration between about 80 and 95%, with about 90% being preferred, oxygen at a concentration between about 5 and 20%, with about 20% being preferred at a combined flow rate between about 130 and 200 SCCCM with about 165 SCCM being preferred.

This establishes a dynamic equilibrium pressure with the vacuum pump of between about 8 and 12 millitorr, with about 10 millitorr being preferred. RF power (at a frequency of 13.56 MHertz) is now applied to the wafer through transformer coupling at a source power level between about 300 and 500 watts. This causes electrical excitation of the gas, thereby forming a high-density low frequency plasma. At the same time bias power, from RF source 9 in FIG. 1 between about 400 and 800 watts, is applied to the chamber walls. It is important to note that the values specified here for the gas composition, wafer and bias power, and pressure are critical for the process of the present invention to be effective. Changing to values outside any of these specified ranges will result in failure of the process.

The seasoning process as described above (i.e. with RF power applied to both the wafer and the walls) is allowed to continue for between about 60 and 140 seconds with about 100 seconds being preferred.

Figure 3:
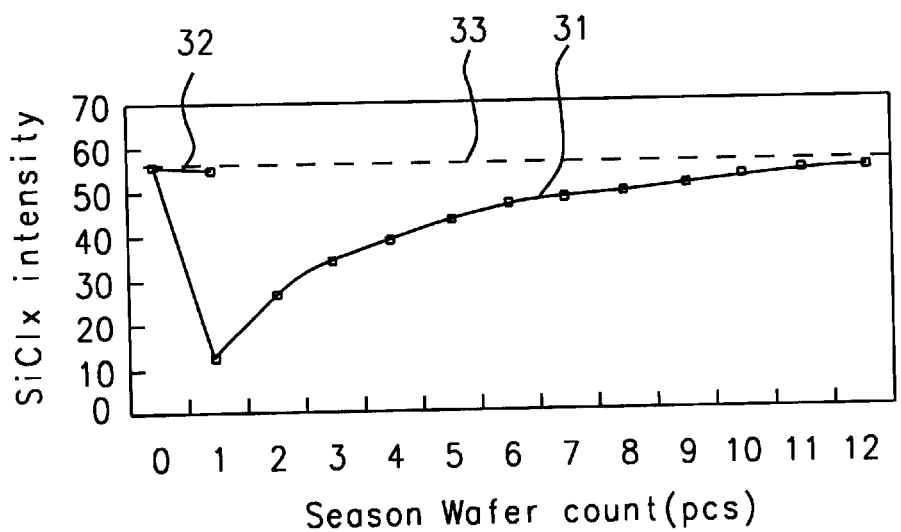
FIG. 3 compares the intensity of the $SiCl_x$ species for both the old method and the method of the present invention.

The effectiveness of the present invention was confirmed by means of optical emission spectroscopy which was used to monitor progress as seasoning proceeded. As discussed earlier, the intensities of the $SiCl_x$ species are well-suited for this purpose. In FIG. 3 we show a plot comparing the intensity of said species as a function of the number of seasoning wafers used. Curve 31 shows results using our old method while curve 32 is for the process of the present invention. Dotted line 33 represents the intensity of SiCl species that would be seen in a fully seasoned unit. It is readily observed that a chamber that has been seasoned according to the teachings of the present invention reaches this level after only one wafer has been run whereas in the old method seasoning is not fully complete even after 12 wafers have been used.

Figure 2:
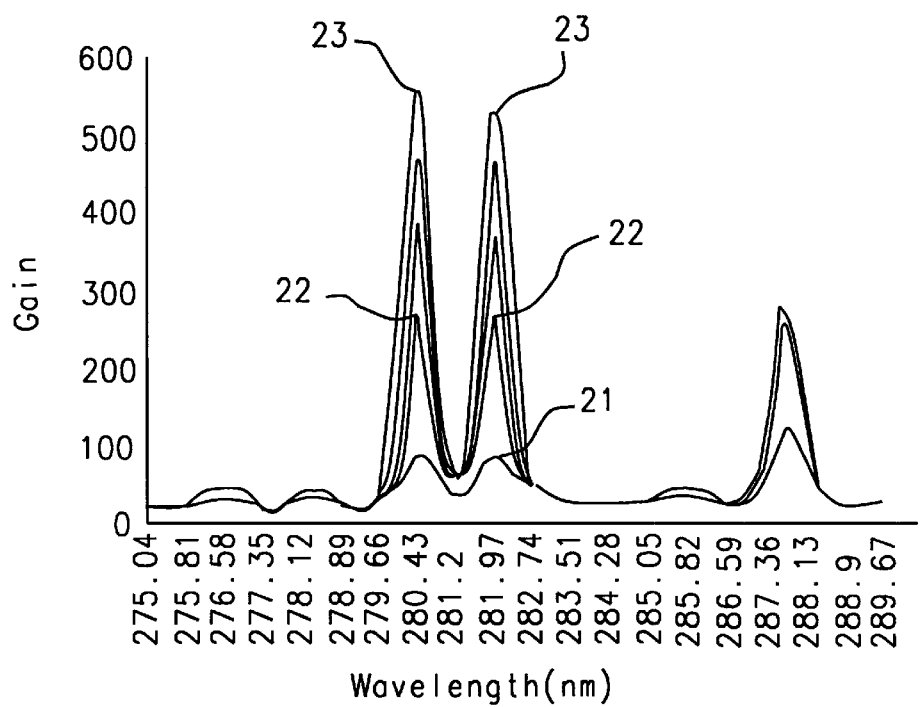
FIG. 2 shows the spectrum of a plasma used during the seasoning process, illustrating how the intensity of certain species increases with time.
Figure 4:
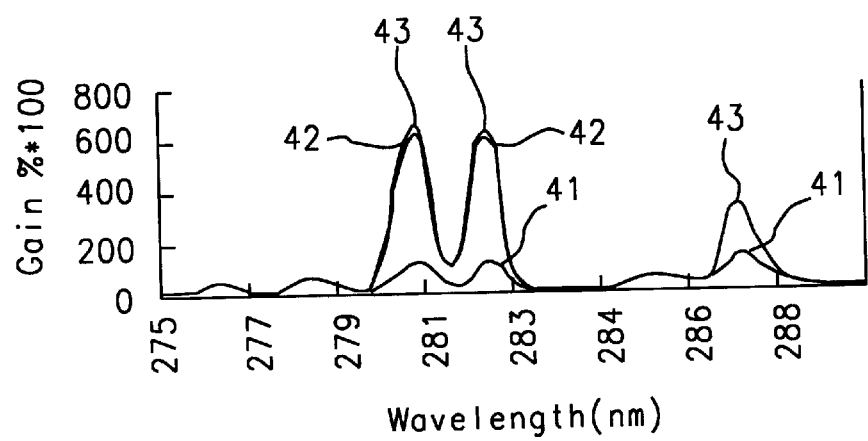
FIG. 4 is similar to FIG. 2 but applies to a seasoning plasma generated according to the teachings of the present invention.

FIG. 4 is a plot of intensity vs. wavelength similar to that shown in FIG. 2. Curve 41 is the spectrum that is seen immediately after dry cleaning. Curve 42 represents the spectrum after 12 wafers have been used following the old method, while spectrum 43 is what is obtained after a single wafer has been used in accordance with the teachings of the present invention.

While the invention has been particularly shown and described with reference to the preferred embodiments thereof, it will be understood by those skilled in the art that various changes in form and details may be made without departing from the spirit and scope of the invention.

What is claimed is:

1. A process for seasoning a high density plasma etcher having walls, comprising:

providing a single blank silicon wafer;

placing said silicon wafer within said plasma etcher;

admitting into the etcher a mixture of chlorine, oxygen, and helium at a flow rate and at a pressure;

through application of RF power to said silicon wafer for a period of time, electrically exciting said gas whereby a high density plasma is formed;

during said time period, also applying RF bias power to the walls; and turning off all RF power thereby completing said seasoning process.

2. The process of claim 1 wherein said blank silicon wafer has a diameter between about 15 and 20 cm.

3. The process of claim 1 wherein said flow rate is between about 130 and 200 SCCM.

4. The process of claim 1 further comprising, within said mixture, chlorine at a concentration between about 80 and 95%, and oxygen at a concentration between about 5 and 20%.

5. The process of claim 1 wherein the application of power to the silicon wafer is achieved by means of TCP.

6. The process of claim 5 wherein RF power to the silicon wafer is between about 300 and 500 watts.

7. The process of claim 1 wherein said RF bias power is between about 200 and 400 watts.

8. The process of claim 1 wherein said time period is between about 60 and 140 seconds.

9. The process of claim 1 wherein said pressure is between about 8 and 12 millitorr.

10. A process for etching silicon, comprising:

(a) providing a plasma etch chamber having interior walls;

(b) placing a single silicon wafer, containing a partially complete integrated circuit, in the chamber;

(c) exposing the wafer to a high density plasma, thereby etching all unprotected silicon surfaces, and then removing the wafer from the chamber;

(d) repeating steps (b) and (c) a number of times, a different wafer being used each time;

(e) then cleaning said interior walls by means of a dry cleaning process;

(f) then placing a blank silicon wafer in the etch chamber and admitting thereto a mixture of chlorine, oxygen, and helium at a flow rate and at a pressure;

(g) through application of RF power to said silicon wafer for a period of time, electrically exciting said gas whereby a high density plasma is formed;

(h) during said time period, also applying RF bias power to the interior walls whereby the chamber is subjected to a seasoning process;

(i) by measuring intensities of two spectral lines due to SiCl species at wavelengths 280.4 and 282 nanometers respectively until said intensities no longer increase over time, monitoring said seasoning process, thereby confirming that sufficient seasoning has been done;

(j) turning off all RF power and removing the blank wafer; and (k) returning to step (b).

11. The process of claim 10 wherein the number of times steps (b) and (c) are repeated is between about 90 and 110.

12. The process of claim 10 wherein the step of cleaning said interior walls by means of a dry cleaning process further comprises placing a thermally oxidized wafer in said chamber and exposing said wafer to a plasma of $SF_6$ gas at an RF source power of about 700 watts for about 300 seconds.

13. The process of claim 10 wherein said flow rate is between about 130 and 200 SCCM.

14. The process of claim 10 further comprising, within said mixture, chlorine at a concentration between about 80 and 95%, and oxygen at a concentration between about 5 and 20%.

15. The process of claim 10 wherein the application of power to the silicon wafer is achieved by means of TCP.

16. The process of claim 15 wherein RF power to the silicon wafer is between about 300 and 500 watts.

17. The process of claim 10 wherein said RF bias power is between about 200 and 400 watts.

18. The process of claim 10 wherein said time period is between about 60 and 140 seconds.

19. The process of claim 10 wherein said pressure is between about 8 and 12 millitorr.

* * * * *